United States Patent
Park et al.

(10) Patent No.: US 10,771,661 B2
(45) Date of Patent: Sep. 8, 2020

(54) CAMERA MODULE

(71) Applicant: LG INNOTEK CO., LTD., Seoul (KR)

(72) Inventors: Yong Tae Park, Seoul (KR); Beom Suk Yu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/338,202

(22) PCT Filed: Oct. 18, 2017

(86) PCT No.: PCT/KR2017/011494
§ 371 (c)(1),
(2) Date: Mar. 29, 2019

(87) PCT Pub. No.: WO2018/074829
PCT Pub. Date: Apr. 26, 2018

(65) Prior Publication Data
US 2019/0227411 A1    Jul. 25, 2019

(30) Foreign Application Priority Data

Oct. 18, 2016  (KR) .................. 10-2016-0134860

(51) Int. Cl.
*H04N 5/225* (2006.01)
*H05K 9/00* (2006.01)
(52) U.S. Cl.
CPC ........... *H04N 5/22521* (2018.08); *H05K 9/00* (2013.01); *H05K 9/0007* (2013.01)
(58) Field of Classification Search
CPC ................................................ H04N 5/22521
See application file for complete search history.

(56) References Cited

U.S. PATENT DOCUMENTS

| 9,369,613 | B2* | 6/2016 | Maekawa | H05K 9/002 |
| 2016/0112607 | A1* | 4/2016 | Yang | H04N 5/2252 |
| | | | | 348/373 |
| 2016/0268716 | A1* | 9/2016 | Conger | H01R 12/716 |
| 2017/0271819 | A1* | 9/2017 | Hehir | H01R 13/6583 |
| 2017/0320449 | A1 | 11/2017 | Park | |
| 2019/0041600 | A1* | 2/2019 | Sakamoto | H05K 9/0081 |

FOREIGN PATENT DOCUMENTS

| JP | 2007-22364 A | 2/2007 |
| KR | 10-2010-0034908 A | 4/2010 |
| KR | 10-1003653 B1 | 12/2010 |
| KR | 10-2012-0003036 A | 1/2012 |
| KR | 10-2016-0045383 A | 4/2016 |
| KR | 10-2016-0057723 A | 5/2016 |
| WO | WO 2016/087227 A1 | 6/2016 |

* cited by examiner

*Primary Examiner* — Clayton E. LaBalle
*Assistant Examiner* — Leon W Rhodes, Jr.
(74) *Attorney, Agent, or Firm* — Birch, Stewart, Kolasch & Birch, LLP

(57) ABSTRACT

An embodiment of a camera module may comprise: a lens part; a front body receiving the lens part; a rear body coupled to the front body; a substrate part received inside the rear body and comprising a plurality of printed circuit boards; a cable electrically connected to the substrate part; a connector part connecting the cable with the substrate part; and a first shielding part, made of a conductive material and disposed at a rear side of the connector part, for shielding electromagnetic noise generated from the substrate part or the outside.

20 Claims, 7 Drawing Sheets

CAMERA MODULE

CROSS REFERENCE TO RELATED APPLICATIONS

This application is the National Phase of PCT International Application No. PCT/KR2017/011494, filed on Oct. 18, 2017, which claims priority under 35 U.S.C. 119(a) to Patent Application No. 10-2016-0134860, filed in the Republic of Korea on Oct. 18, 2016, all of which are hereby expressly incorporated by reference into the present application.

TECHNICAL FIELD

Embodiments relate to a camera module having a structure which may improve Electro Magnetic Compatibility (EMC).

BACKGROUND ART

Contents which will be described hereinafter serve simply to provide background information of embodiments and do not constitute related art.

Camera modules having various purposes can be mounted in vehicles. For example, a camera module which may secure a rear view when a vehicle is parked may be mounted at a rear part of the vehicle.

Further, a black box for vehicles which is recently used to trace an accident sequence and a cause of a traffic accident when the traffic accident occurs may use a camera module. Moreover, use of a camera module as a recognition device to clearly and easily grasp the situation of a blind spot, which is difficult for a vehicle driver or passengers to confirm with the naked eye, is being gradually increased now.

Recently, manufacture of so-called, smart cars, i.e., vehicles loaded with a collision warning system which detects possibilities of front and rear collisions in advance to prepare for collisions when a vehicle is driven, a collision avoidance system which allows a control device mounted on a vehicle to directly avoid collision with another vehicle rather than by driver's driving, etc., is increased, and development of related technologies is increased.

Use of a camera module as an external situation recognition device of these smart cars is increasing and, thereby, manufacture of camera modules for vehicles and development of related technologies tend to be increased.

DISCLOSURE

Technical Problem

Embodiments provide a camera module having a structure which may improve Electro Magnetic Compatibility (EMC).

Technical objects of embodiments are not limited to the above-described objects, and additional advantages, objects, and features of the embodiments will be set forth in part in the description which follows and in part will become apparent to those having ordinary skill in the art upon examination of the following or may be learned from practice of the embodiments.

Technical Solution

In one embodiment, a camera module includes a lens part, a front body configured to receive the lens part, a rear body coupled to the front body, a substrate part received within the rear body and including a plurality of printed circuit boards, a cable conductively connected to the substrate part, a connector part configured to connect the cable to the substrate part, and a first shielding part formed of a conductive material and arranged at the rear of the connector part to shield electromagnetic noise generated from the substrate part or the outside.

In another embodiment, a camera module includes a lens part, a front body configured to receive the lens part, a rear body coupled to the front body, a substrate part received within the rear body and including a plurality of printed circuit boards, a shield member provided to surround the substrate part, a cable conductively connected to the substrate part, a connector part configured to connect the cable to the substrate part, a first shielding part formed of a conductive material and arranged at the rear of the connector part to shield electromagnetic noise generated from the substrate part or the outside, a holder coupled to the rear body, the cable passing through the holder, and a second shielding part formed of a conductive material and arranged between the rear body and the holder to shield the electromagnetic noise generated from the substrate part or the outside, wherein the rear body is formed of a conductive material and the first shielding part and the second shielding part are conductively connected to the rear body.

Advantageous Effects

In embodiments, a first shielding part and a second shielding part are arranged adjacent to a region in which a cable is arranged, and may thus effectively shield electromagnetic noise propagating through the region in which the cable is arranged and effectively improve Electro Magnetic Compatibility of a camera module or electronic devices around the camera module.

BEST MODE

Hereinafter, embodiments will be described with reference to the annexed drawings and description. However, the embodiments set forth herein may be variously modified, and it should be understood that there is no intent to limit the disclosure to the particular forms disclosed. However, the embodiments are to cover all modifications, equivalents, and alternatives falling within the spirit and scope of the disclosure as defined by the claims.

It will be understood that, although the terms "first", "second", etc. may be used herein to describe various elements, these terms do not limit the elements. These terms are used only to discriminate one substance or element from other substances or elements. Further, terms specially defined in consideration of the configurations and functions of the embodiments serve only to describe the embodiments and do not limit the scope of the embodiments.

In the following description of the embodiments, it will be understood that, when each element is referred to as being formed "on" or "under" another element, it can be directly on or under the other element or be indirectly formed with one or more intervening elements therebetween. Further, when an element is referred to as being formed "on" or "under" another element, not only the upward direction of one element but also the downward direction of the element may be encompassed.

In addition, it will be understood that, although the relational terms "on/above/upper", "under/below/lower", etc. may be used herein to describe various elements, these terms neither necessarily require nor connote any physical or logical relations between substances or elements or the order thereof, and are used only to discriminate one substance or element from other substances or elements.

Figure 1:
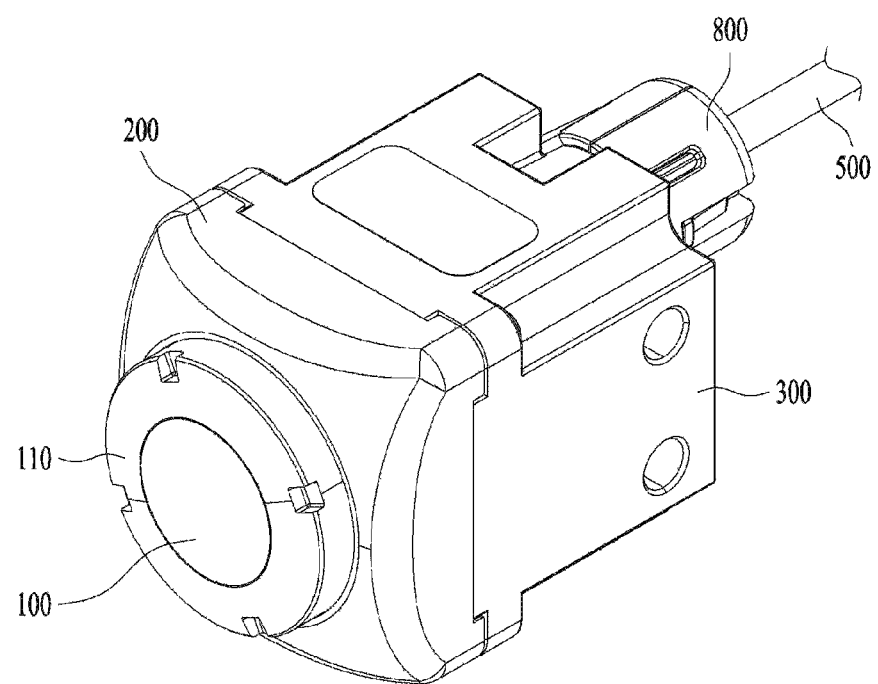
FIG. 1 is a perspective view illustrating a camera module in accordance with one embodiment.
Figure 2:
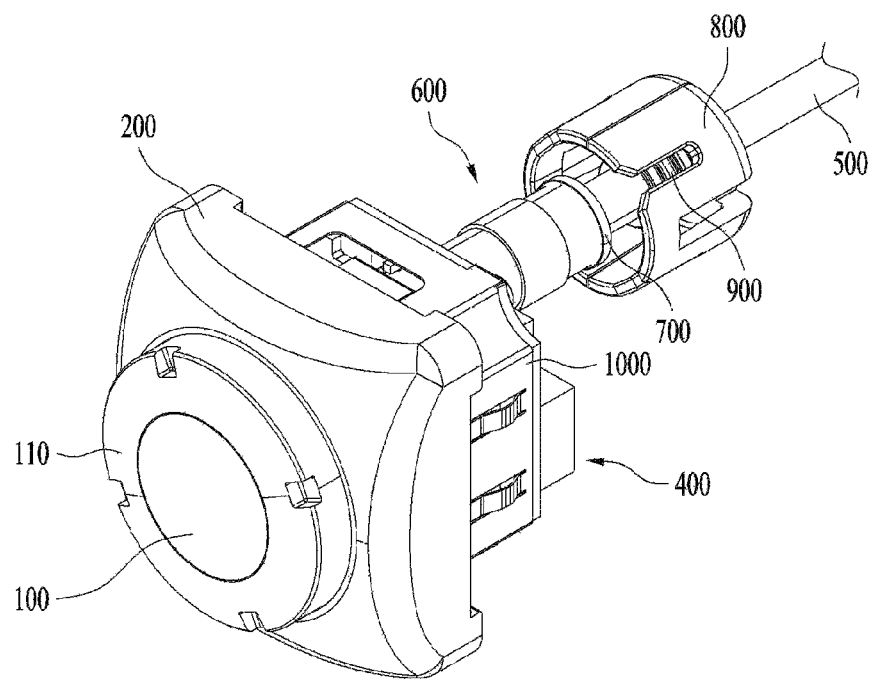
FIG. 2 is a view of FIG. 1, from which a rear body is removed.
Figure 3:
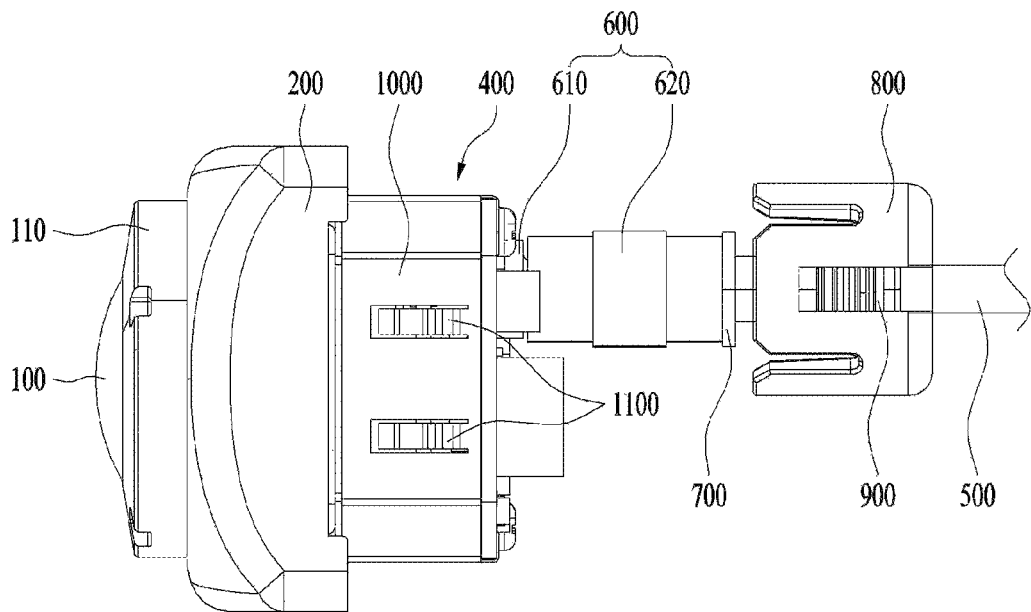
FIG. 3 is a side view of FIG. 2.

Further, in the drawings, a Cartesian coordinate system (x, y, z) may be used. In the drawings, the x-axis and the y-axis define a plane which is perpendicular to an optical axis and, for convenience, an optical axis direction (the z-axis direction) may be referred to as a first direction, the x-axis direction may be referred to as a second direction, and the y-axis direction may be referred to as a third direction FIG. 1 is a perspective view illustrating a camera module in accordance with one embodiment. FIG. 2 is a view of FIG. 1, from which a rear body 300 is removed. FIG. 3 is a side view of FIG. 2.

The camera module in accordance with this embodiment may include a lens part 100, a front body 200, the rear body 300, a substrate part 400 (referring to FIG. 4), a cable 500, a first shielding part 700, a holder 800, a second shielding part 900 and a shield member 1000.

External light is incident upon the lens part 100, and the lens part 100 may include a lens barrel 10 (referring to FIG. 4) in which at least one lens is mounted. Here, the lens barrel 10 may include a single lens, or include a plurality of lenses arranged in the optical axis direction, i.e., the first direction. In another embodiment, one lens or a plurality of lenses may be coupled directly to the front body 200 without a lens barrel.

Further, since the lens part 100 may be coupled to the front body 200 by a method, such as screw coupling, shape fit, interference fit or the like, a sealing member (referring to FIG. 4) to prevent moisture, dust and other foreign substances from being introduced into the camera module through a gap in a coupling region between the lens part 100 and the front body 200 may be provided.

In order to stably couple the lens part 100 to the front body 200, for example, a fastening member 110 to fasten the lens part 100 to the front body 200 may be provided, as exemplarily shown in FIG. 1. The fastening member 110 may have a hollow, the lens part 100 may be mounted in the hollow, and the fastening member 110 may be coupled to the front body 200 by a method, such as screw coupling, coupling using an adhesive or the like, and thus couple the lens part 100 to the front body 200.

The front body 200 may be hollow-shaped so as to receive the lens part 100 in an inner space thereof. The lens part 100 may be mounted at a front portion of the front body 200. For this purpose, a hollow in which the lens part 100 is mounted may be formed in the front body 200.

The front body 200 may be coupled to the rear body 300. Coupling between the front body 200 and the rear body 300 may be carried out, for example, by couplers. For this purpose, as exemplarily shown in FIG. 1, through holes, into which the couplers are inserted, may be formed at corners of the front body 200.

Further, in order to secure spaces in which the couplers are arranged, as exemplarily shown in FIG. 1, escape parts may be formed at corners of the rear body 300, i.e., regions of the rear body 300 in which the couplers are arranged.

By forming the escape parts on the rear body 300, escape parts may be formed at regions of the substrate part 400 received in the rear body 300, corresponding to the escape parts of the rear body 300, as exemplarily shown in FIG. 2.

However, this is just one embodiment and, in other embodiments, front bodies 200, 200 and a housing may be coupled by adhesion, shape fit, interference fit or the like.

The rear body 300 may be coupled to the front body 200 and receive the substrate part 400. Therefore, the rear body 300 may have an inner space to receive the substrate part 400.

Further, a first protrusion 310 (referring to FIG. 4), which serves as a passage through which the cable 500 passes, and, to which the holder 800 is coupled, may be formed at a rear portion of the rear body 300. A detailed structure of the rear body 300 will be described below with reference to FIG. 4 and so on.

The substrate part 400 may be received in the rear body 300 and include a plurality of printed circuit boards. The substrate part 400 may be arranged to be spaced apart from the lens part 100 in the optical axis direction, as exemplarily shown in FIG. 1.

The substrate part 400 may include an image sensor 411 (referring to FIG. 6), which converts light incident upon the image sensor 411 from the lens part 100 into an image. A detailed structure of the substrate part 400 will be described below with reference to FIG. 4 and so on.

The cable 500 may be conductively connected to the substrate part 400 and serve as a passage to provide electric power from an external power supply to the substrate part 400. Further, the substrate part 400 may transceive an electrical signal with an external device through the cable 500.

The cable 500 may be provided in a form in which a plurality of wires is covered with a protective layer. The cable 500 may be connected to the substrate part 400 by a connector part 600.

The connector part 600 may function to connect the cable 500 to the substrate part 400, and include a first connector 610 and a second connector 620, as exemplarily shown in FIG. 3.

The first connector 610 may be coupled directly to the substrate part 400, and the second connector 620 may function to conductively connect the first connector 610 to the cable 500. That is, one side of the second connector 620 may be coupled to the first connector 610, the first shielding part 700 may be coupled to the other side of the second connector 620, and thus the second connector 620 may connect the first connector 610 and the cable 500.

Figure 4:
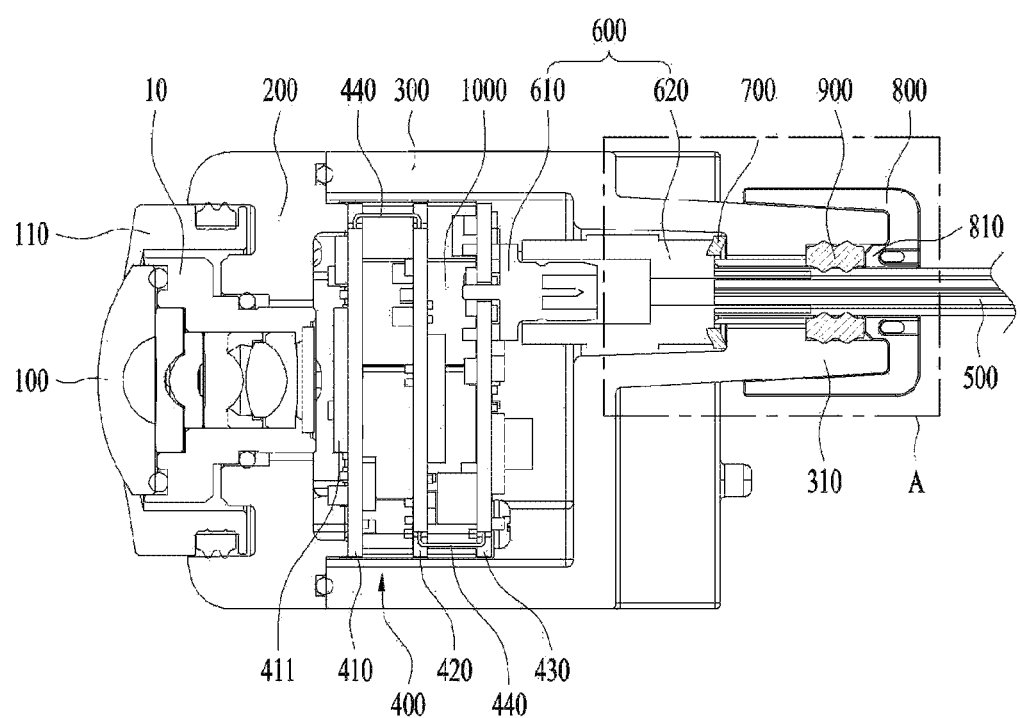
FIG. 4 is a longitudinal-sectional view of the camera module in accordance with one embodiment.

Referring to FIG. 4, the first connector 610 may be coupled to, for example, a third substrate 430 arranged at the rearmost region of the substrate part 400, the second connector 620 may be coupled to the first connector 610, and the cable 500 may be coupled to the second connector 620. Due to such a substrate, the substrate part 400 and the cable 500 may be conductively connected.

The first shielding part 700 may be formed of a conductive material, be arranged at the rear of the connector part 600, and function to shield electromagnetic noise generated from the substrate part 400 or the outside, as exemplarily shown in FIGS. 2 and 3. The first shielding part 700 will be described in detail below with reference to FIG. 4 and so on.

The holder 800 may be coupled to the rear body 300 and the cable 500 may pass through the holder 800. The holder 800 is coupled to the first protrusion 310 of the rear body 300 and may thus simultaneously function to support the cable 500 and to support the second shielding part 900 which will be described below. The holder 800 may be coupled to the first protrusion 310 by an adhesive or the like.

The second shielding part 900 may be formed of a conductive material, be arranged between the rear body 300 and the holder 800, and function to shield electromagnetic noise generated from the substrate part 400 or the outside, together with the first shielding part 700. The second shielding part 900 will be described in detail below with reference to FIG. 4 and so on.

The shield member 1000 may be provided to surround the substrate part 400, as exemplarily shown in FIG. 2. The shield member 1000 may function to prevent the substrate part 400 from being damaged due to collision with the inner wall of the rear body 300.

Further, the shield member 1000 may be formed of a conductive material, such as metal or the like, and may thus function to shield electromagnetic noise generated from the substrate part 400 or the outside, together with the first shielding part 700 and the second shielding part 900.

That is, the shield member 1000 may prevent electromagnetic noise generated from the substrate part 400 from propagating to the outside of the camera module, or, in contrast, prevent noise generated from the outside of the camera module from propagating to the substrate part 400.

Figure 5:
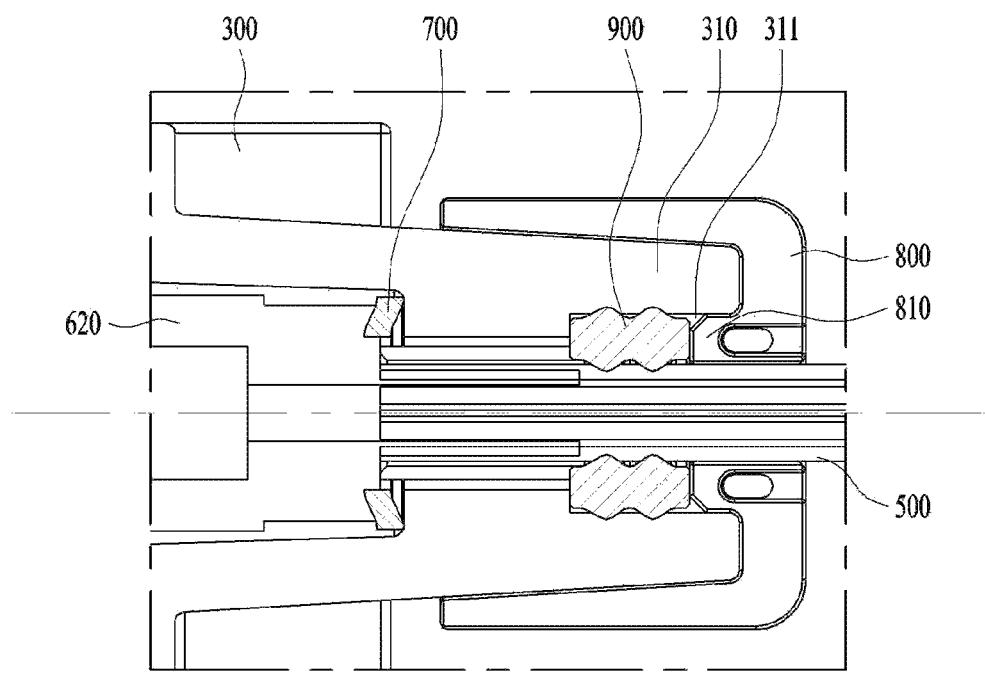
FIG. 5 is an enlarged view of a portion A of FIG. 4.

FIG. 4 is a longitudinal-sectional view of the camera module in accordance with one embodiment. FIG. 5 is an enlarged view of a portion A of FIG. 4.

When electric power is supplied to the substrate part 400 and the image sensor 411 and other elements provided on the substrate part 400 are operated, electromagnetic noise may be generated from the respective elements provided on the substrate part 400.

When noise generated from the substrate part 400 propagates to the outside of the camera module in the form of an electromagnetic wave, the noise causes Electro Magnetic Interference (EMI) with other electronic devices arranged around the camera module and may thus degrade performance of the electronic devices.

In contrast, when noise generated from the electronic devices arranged around the camera module propagates to the inside of the camera module, the noise causes Electro Magnetic Interference (EMI) with the substrate part 400 within the camera module and may thus cause performance degradation, such as degradation of image quality, of the camera module.

Therefore, if noise generated from the electronic devices around the camera module propagates to the substrate part 400 within the camera module, Electro Magnetic Compatibility (EMC) of the camera module may be lowered due to Electro Magnetic Interference.

In contrast, if noise generated from the substrate part 400 propagates to the outside of the camera module, Electro Magnetic Compatibility of the electronic devices around the camera module may be lowered.

In order to suppress such Electro Magnetic Interference, it is necessary to electromagnetically shield the substrate part 400 arranged within the rear body 300 of the camera module from the outside of the camera module. That is, the camera module requires a shielding unit to shield electromagnetic noise generated from the substrate part 400 or the outside.

For this purpose, in this embodiment, the shield member 1000 formed of a conductive material and surrounding the substrate part 400 may serve as the noise shielding unit. Further, the rear body 300 configured to receive the substrate part 400 and the front body 200 coupled to the rear body 300 may be formed of a conductive material and used as a ground unit of the substrate part 400, and thus serve as the noise shielding unit.

However, referring to FIG. 4, a gap in a region in which the cable 500 connected to the substrate part 400 is arranged may be formed, noise may propagate in the form of an electromagnetic wave through such a gap from the substrate part 400 to the outside or from the outside to the substrate part 400, and the noise may propagate through the cable 500. The propagating noise may degrade Electro Magnetic Compatibility of the camera module or electronic devices around the camera modules.

Therefore, in this embodiment, the first shielding part 700 and the second shielding part 900 may be provided in the region in which the cable 500 is arranged, so as to shield electromagnetic noise. FIGS. 4 and 5 illustrate the first shielding part 700 and the second shielding part 900 as overlapping other elements, the reason why the first shielding part 700 and the second shielding part 900 are illustrated as overlapping other elements is to illustrate circular shapes of the first shielding part 700 and the second shielding part 900, and the shapes of the first shielding part 700 and the second shielding part 900 may be modified.

The first shielding part 700 may be formed of a conductive material, such as metal or the like, and be arranged between the second connector 620 and a stair of the first protrusion 310. The first shielding part 700 is formed of the conductive material and may thus absorb noise propagating in the form of an electromagnetic wave from the substrate part 400 or the outside of the camera module.

Here, since the noise propagating from the inside to the outside of the camera module or from the outside to the inside of the camera module may propagate though the cable 500 or the gap in the region in which the cable 500 is arranged, as described above, the first shielding part 700 may be arranged adjacent to the cable 500.

The rear body 300 may be formed of a conductive material, such as metal or the like, and the first shielding part 700 may be conductively connected to the rear body 300.

In order to increase durability of the rear body 300, at least some regions of the outer wall and the inner wall of the rear body 300 may be coated with a nonconductive material, and, in this embodiment, a region of the inner wall of the rear body 300, contacting the first shielding part 700, may not be coated with the nonconductive material. In another embodiment, the region of the inner wall of the rear body 300, contacting the first shielding part, may be coated with a conductive material.

Since the first shielding part 700 and the rear body 300 are conductively connected through such a structure and the rear body 300 is used as a ground unit, noise absorbed by the first shielding part 700 may propagate to the rear body 300 and be removed by grounding.

As exemplarily shown in FIGS. 3 and 5, the first shielding part 700 may be formed to have a ring shape and provided to surround the outer circumferential surface of the cable 500. Due to such a structure, noise propagating along the region in which the cable 500 is arranged may be effectively absorbed by the first shielding part 700.

The first shielding part 700 may be provided as, for example, a washer. Here, as the washer, one of various kinds of washers, such as a plain washer, a spring washer, a toothed lock washer having toothed structures formed on the inner or outer circumferential surface thereof, a dish-type washer, one surface of which protrudes, as shown in FIG. 5, may be used.

The second shielding part 900 may be formed of a conductive material, such as metal or the like, and be arranged between the first protrusion 310 and the holder 800. As exemplarily shown in FIG. 3, the first protrusion 310 through which the cable 500 passes may be formed at the rear portion of the rear body 300. A penetration part into which the cable 500 is inserted may be formed in the first protrusion 310, and the second shielding part 900 may be arranged in a partial region of the penetration part.

That is, the first protrusion 310 through which the cable 500 passes is formed at the rear portion of the rear body 300, a receipt groove 311 is formed in a partial region of the penetration part of the first protrusion 310 into which the cable 500 is inserted, and the second shielding part 900 may be arranged in the receipt groove 311.

The holder 800 may include a second protrusion 810 inserted into the receipt groove 311 and, when the holder 800 is coupled to the first protrusion 310, the second protrusion 810 may be inserted into the receipt groove 311. When the holder 800 is coupled to the first protrusion 310, the second shielding part 900 may be arranged in a space formed by the receipt groove 311, the second protrusion 810 and the cable 500.

Here, since the noise propagating from the inside to the outside of the camera module or from the outside to the inside of the camera module may propagate though the cable 500 or the gap in the region in which the cable 500 is arranged, as described above, the second shielding part 900 may be arranged adjacent to the cable 500.

For example, as exemplarily shown in FIG. 5, the second shielding part 900 may be formed to have a ring shape and provided to surround the outer circumferential surface of the cable 500. Due to such a structure, noise propagating along the region in which the cable 500 is arranged may be effectively absorbed by the second shielding part 900.

The second shielding part 900 is formed of the conductive material and may thus absorb noise propagating in the form of an electromagnetic wave from the substrate part 400 or the outside of the camera module.

Further, the second shielding part 900 may be conductively connected to the rear body 300 formed of a conductive material. That is, the first protrusion 310 and the second shielding part 900 may be conductively connected. Such a conductive connection method is the same as or similar to the above-described conductive connection method between the first shielding part 700 and the rear body 300.

Since the second shielding part 900 and the rear body 300 are conductively connected and the rear body 300 is used as the ground unit, noise absorbed by the second shielding part 900 may propagate to the rear body 300 and be removed by grounding.

The second shielding part 900 may function to seal the part of the rear body 300 penetrated by the cable 500. For the purpose of sealing, the second shielding part 900 may be formed to have a sufficient width for sealing in the optical axis direction.

The second shielding part 900 may not only function to shield noise but also function as a sealing member to prevent moisture, dust and other foreign substances from being introduced into the camera module through a gap in the region penetrated by the cable 500.

In order to shield noise and achieve sealing, the second shielding part 900 may be formed of, for example, aluminum, copper or a material including at least one thereof.

As described above, the first shielding part 700 and the second shielding part 900 are arranged in the region penetrated by the cable 500 at a regular distance in the optical axis direction, and may thus effectively shield electromagnetic noise generated from the substrate part 400 or the outside.

In this embodiment, the first shielding part 700 and the second shielding part 900 are arranged adjacent to the region in which the cable 500 is arranged, and may thus effectively shield electromagnetic noise propagating through the region in which the cable 500 is arranged and effectively improve Electro Magnetic Compatibility of the camera module or the electronic devices around the camera module.

Figure 6:
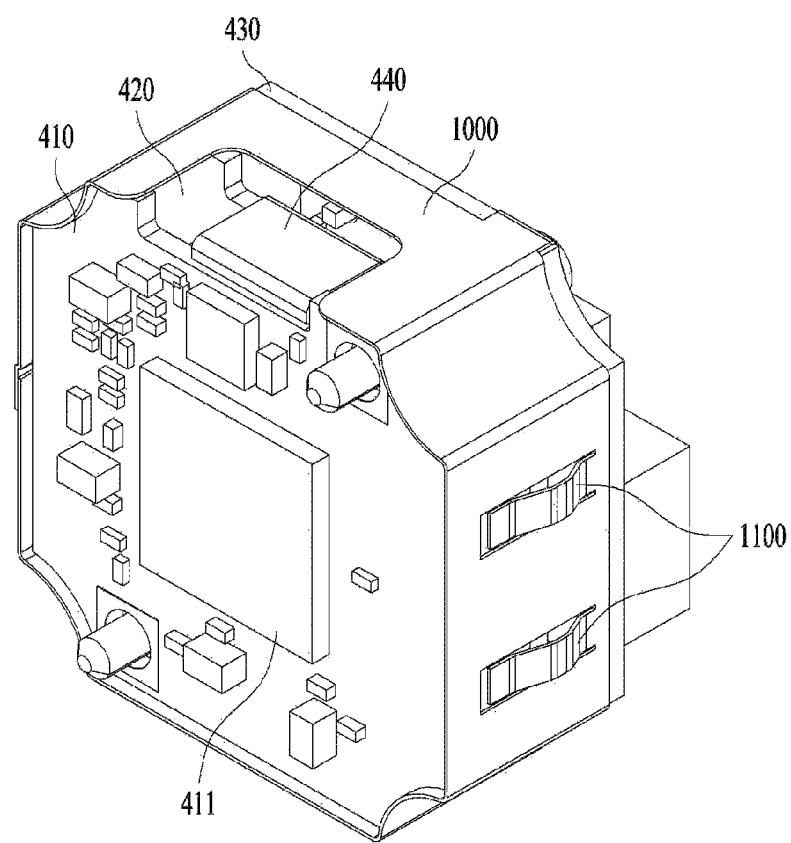
FIG. 6 is a view illustrating a substrate part in accordance with one embodiment.
Figure 7:
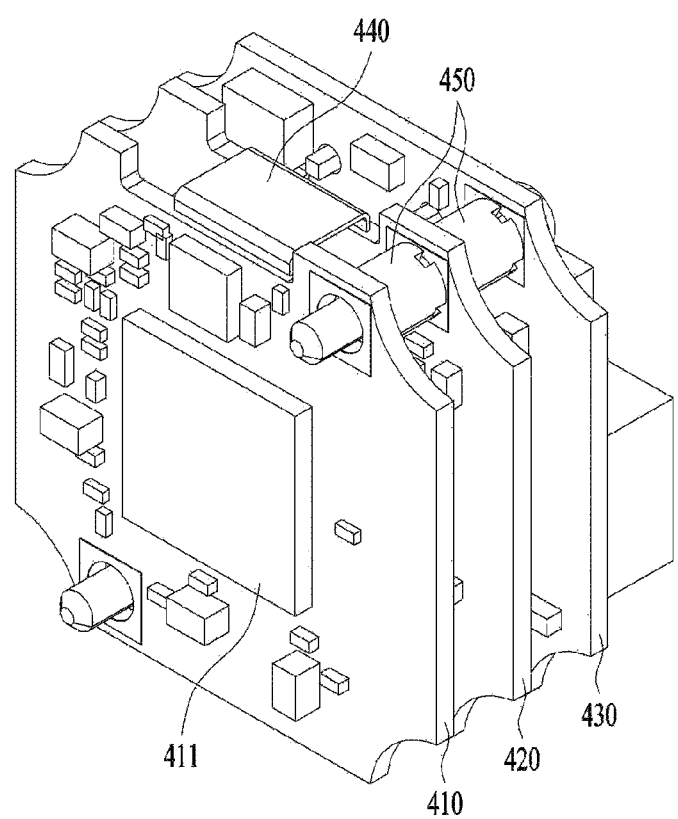
FIG. 7 is a view of FIG. 6, from which a shield member is removed.
Figure 8:
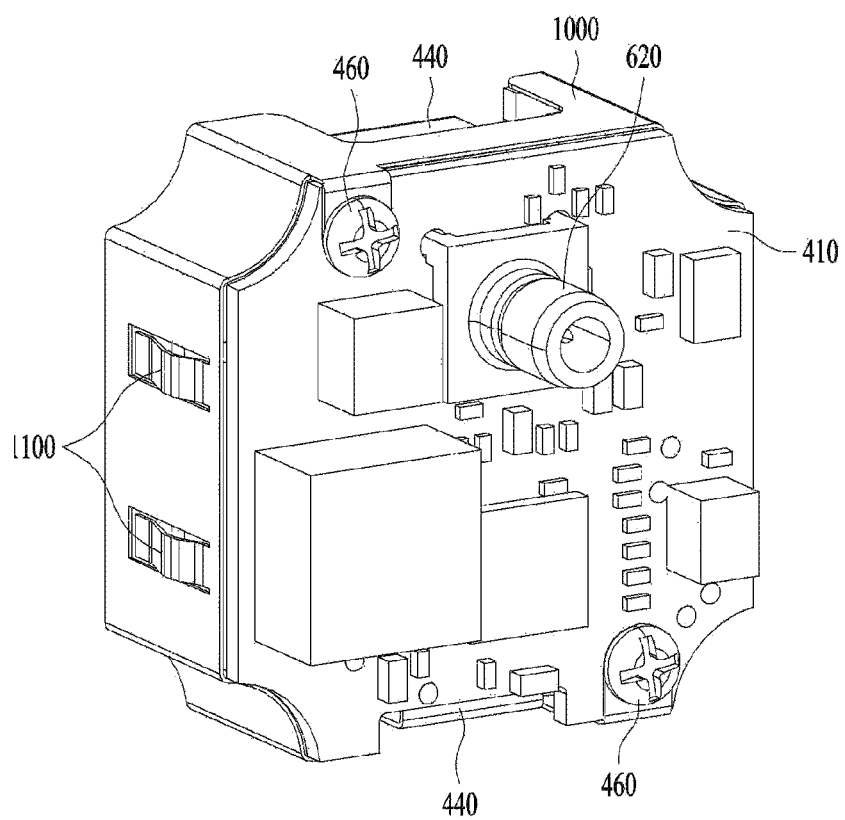
FIG. 8 is a rear perspective view of FIG. 7.

FIG. 6 is a view illustrating the substrate part 400 in accordance with one embodiment. FIG. 7 is a view of FIG. 6, from which the shield member 1000 is removed. FIG. 8 is a rear perspective view of FIG. 7. The substrate part 400 in accordance with this embodiment may include a first substrate 410, a second substrate 420, the third substrate 430, connection parts 440, spacing members 450 and the shield member 1000.

The first substrate 410 may be arranged to be opposite to the lens part 100. The third substrate 430 may be arranged to be spaced apart from the first substrate 410 in the optical axis direction. The second substrate 420 may be arranged between the first substrate 410 and the third substrate 430 to be spaced apart from the first substrate 410 and the third substrate 430, respectively.

The first substrate 410, which is opposite to the lens part 100, may be arranged adjacent to the lens part 100, the image sensor 411 may be mounted on a surface of the first substrate 410 opposite to the lens part 100, i.e., the front surface of the first substrate 410, and an electromagnetic circuit provided with various other circuit elements may be formed on the first substrate 410.

The image sensor 411 may sense light incident through the lens part 100, and the first substrate 410 may function to convert a sensed image into an electrical signal and transmit the electrical signal to an external image storage device or image reproducing device. However, conversion of the sensed image into the electrical signal may also be performed by other substrates.

The second substrate 420 may be arranged between the first substrate 410 and the third substrate 430 and conductively connected to the first substrate 410 and the third substrate 430, and an electromagnetic circuit may be formed on the second substrate 420.

The second substrate 420 may function as an electrical passage to supply necessary electric power to the first substrate 410, and function to transmit an electrical signal regarding the sensed image transmitted from the first substrate 410 to the external image storage device or image reproducing device.

For example, the second substrate 420 may function to convert the sensed image transmitted from the first substrate 410 into an electrical signal and then to transmit the electrical signal to the external image storage device or image reproducing device, or function to rectify electric power input from the third substrate 430 and then to transmit the power to the first substrate 410.

That is, the second substrate 420 may be arranged between the first substrate 410 and the third substrate 430 and divisionally perform the functions performed by the first substrate 410 and the third substrate 430.

The third substrate 430 may be arranged at the rear of the second substrate 420 and conductively connected to the second substrate 420, and an electromagnetic circuit may be formed on the third substrate 430. As described above, the third substrate 430 may be conductively connected to the connector part 600 and the cable 500.

The third substrate 430 may function to receive electric power necessary to operate the camera module from the outside and then to transmit the electric power to the first substrate 410 and the second substrate 420, and function to transmit an electrical signal regarding the sensed image transmitted from the second substrate 420 to the external image storage device or image reproducing device.

Therefore, elements, such as a condenser, a rectifier, a transformer, etc. to supply electric power having proper voltage and current required to operate the camera module, may be mounted on the third substrate 430.

Further, the third substrate 430 may be conductively connected to the connector part 600, as described above, so as to be conductively connected to the external image storage device and image reproducing device, a camera module control device, etc. That is, as exemplarily shown in FIG. 8, the first connector 610 of the connector part 600 may be coupled to the third substrate 430.

The connection parts 440 may serve to conductively connect the substrates and be formed of a flexible material. That is, the connection parts 440 conductively connect the first substrate 410, the second substrate 420 and the third substrate 430 and, thus, the connection parts 440 may be provided in a smaller number than the number of the substrates. In this embodiment, a total of three substrates is provided and, thus, two connection parts, i.e., a connection part configured to connect the first substrate 410 and the second substrate 420 and a connection part configured to connect the second substrate 420 and the third substrate 430, may be provided.

Although, in this embodiment, one connection part 440 configured to connect the respective substrates is provided at a side surface of each substrate, the disclosure is not limited thereto, and the number and arrangement positions of the connection parts 440 may be selected in consideration of the circuit structures of the respective substrates and the overall structure of the camera module.

The connection parts 440 may be formed of a flexible material, considering that the connection parts 440 should be easily coupled to the respective substrates and absorb impact and vibration applied from the outside of the camera module so as not to be damaged by such impact and vibration. Therefore, the connection parts 440 may be formed of a flexible circuit board.

However, the disclosure is not limited thereto, and the connection parts 440 may be formed of a rigid material which is resistant to impact and vibration, or be formed of a wire bundle.

Further, in order to couple the connection parts 440 to the respective substrates, soldering, an adhesion method using an electrically conductive adhesive, etc. may be used. In another embodiment, the connection parts 440 may be formed integrally with the first substrate 410 to the third substrates 430 by stacking. These connection parts 440 may function as board to board (B2B) connectors which conductively connect the respective substrates.

The spacing members 450 may function to space the first substrate 410, the second substrate 420 and the third substrate 430 apart from each other by a set distance, as exemplarily shown in FIG. 7. The spacing members 450 may be coupled to the above-described substrates, for example, by a screw coupling method, and be coupled to regions of the respective substrates in which no element or circuit is arranged.

Although a proper number of the spacing members 450 may be selected, in order to stably and firmly maintain a spacing state between the respective substrates, at least two spacing members 450 may be arranged.

The shield member 1000 may be provided to surround the substrate part 400, prevent the substrate part 400 from being damaged due to collision with the inner wall of the rear body 300, and be formed of a conductive material and thus function to shield electromagnetic noise generated from the substrate part 400 or the outside.

Referring to FIGS. 7 and 8, in order to simplify the configuration of the substrate part 400 and secure a space of the substrate part 400 in which elements or circuits are formed, the shield member 1000 may be arranged on the substrate part 400 by coupling the shield member 1000 to fastening screws 460 to which the spacing members 450 are coupled.

Protruding supports 1100 may be formed on the shield member 1000. The protruding supports 1100 may space the shield member 1000 and the inner wall of the rear body 300 apart from each other and thus prevent the substrate part 400 from colliding with the inner wall of the rear body 300. Here, the protruding supports 1100 are elastically deformable and may thus relieve impact applied to the substrate part 400 even when the shield member 1000 collides with the inner wall of the rear body 300.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

INDUSTRIAL APPLICABILITY

In embodiments, a first shielding part and a second shielding part are arranged adjacent to a region in which a cable is arranged, and may thus effectively shield electromagnetic noise propagating through the region in which the cable is arranged and effectively improve Electro Magnetic Compatibility of a camera module or electronic devices around the camera module.

The invention claimed is:
1. A camera module comprising:
a lens part;
a front body configured to receive the lens part;
a rear body coupled to the front body;
a substrate part received within the rear body and comprising a plurality of printed circuit boards;
a cable conductively connected to the substrate part;
a connector part disposed in the rear body and configured to connect the cable to the substrate part, the connector part having a first end connected to the substrate part and a distal end spaced from the substrate; and
a first shielding part disposed between the rear body and the distal end of the connector part and formed of a conductive material, the rear body enclosing the first shielding part, wherein an inner wall of the rear body includes a first conductive portion contacting the first shielding part.

2. The camera module according to claim 1, wherein the connector part comprises:
a first connector coupled to the substrate part; and
a second connector provided with one side coupled to the first connector and the other side to which the first shielding part is coupled.

3. The camera module according to claim 1, wherein the first shielding part is formed to have a ring shape and provided to surround an outer circumferential surface of the cable.

4. The camera module according to claim 1, wherein the first shielding part is configured to be grounded to the first conductive portion of the inner wall of the rear body.

5. The camera module according to claim 1, wherein the substrate part comprises:
a first substrate arranged to be opposite to the lens part;
a third substrate arranged to be spaced apart from the first substrate in an optical axis direction; and
a second substrate arranged between the first substrate and the third substrate to be spaced apart from the first substrate and the third substrate.

6. The camera module according to claim 5, wherein the connector is electrically connected to the third substrate.

7. The camera module according to claim 1, further comprising a shield member provided to surround the substrate part.

8. The camera module according to claim 1, further comprising a second shielding part disposed between the inner wall of the rear body and the cable and formed of a conductive material.

9. The camera module according to claim 8, wherein a first protrusion is formed on the rear body such that the cable passes through the first protrusion, and wherein the second shielding part is disposed between the first protrusion and the cable.

10. A camera module comprising:
a lens part;
a front body configured to receive the lens part;
a rear body coupled to the front body;
a substrate part received within the rear body and comprising a plurality of printed circuit boards;
a cable conductively connected to the substrate part;
a connector part disposed in the rear body and configured to connect the cable to the substrate part; and
a first shielding part disposed between the rear body and the connector part and formed of a conductive material,
a holder coupled to the rear body, the cable passing through the holder; and
a second shielding part formed of a conductive material and arranged between the rear body and the holder to shield the electromagnetic noise generated from the substrate part or the outside,
wherein an inner wall of the rear body includes a first conductive portion contacting the first shielding part.

11. The camera module according to claim 10, wherein:
a first protrusion is formed on the rear body such that the cable passes through the first protrusion;
the holder is coupled to the first protrusion; and
the second shielding part is arranged between the first protrusion and the holder.

12. The camera module according to claim 11, wherein the second shielding part is arranged in a receipt groove formed on the first protrusion.

13. The camera module according to claim 12, wherein the holder includes a second protrusion inserted into the receipt groove.

14. The camera module according to claim 10, wherein the second shielding part is configured to seal a part of the rear body penetrated by the cable.

15. The camera module according to claim 14, wherein the second shielding part is formed to have a ring shape and provided to surround an outer circumferential surface of the cable.

16. The camera module according to claim 10, wherein the second shielding part is electrically connected to the rear body.

17. The camera module according to claim 10, wherein the inner wall of the rear body includes a second conductive portion contacting the second shielding part.

18. The camera module according to claim 17, wherein the second shielding part is configured to be grounded to the second conductive portion of the inner wall of the rear body.

19. A camera module comprising:
a front body;
a lens part disposed in the front body;
a rear body coupled to the front body;
a substrate part disposed in the rear body and comprising a plurality of printed circuit boards;
a cable conductively connected to the substrate part;
a connector part disposed in the rear body and configured to connect the cable to the substrate part;
a first shielding part disposed between the rear body and the connector part and formed of a conductive material; and
a second shielding part disposed between an inner wall of the rear body and the cable and formed of a conductive material,
wherein the inner wall of the rear body comprises:
a first conductive portion contacting the first shielding part; and
a second conductive portion contacting the second shielding part.

20. A camera module comprising:
a lens part;
a front body configured to receive the lens part;
a rear body coupled to the front body;
a substrate part received within the rear body and comprising a plurality of printed circuit boards;
a shield member provided to surround the substrate part;
a cable conductively connected to the substrate part;
a connector part configured to connect the cable to the substrate part;
a first shielding part formed of a conductive material and arranged at a rear most part of the connector part spaced from the substrate to shield electromagnetic noise generated from the substrate part or the outside;
a holder coupled to the rear body, the cable passing through the holder; and
a second shielding part formed of a conductive material and arranged between the rear body and the holder to shield the electromagnetic noise generated from the substrate part or the outside,
wherein the rear body is formed of a conductive material, and the first shielding part and the second shielding part are conductively connected to the rear body.

* * * * *